United States Patent [19]

Proebsting

[11] Patent Number: 4,502,140
[45] Date of Patent: Feb. 26, 1985

[54] GO/NO GO MARGIN TEST CIRCUIT FOR SEMICONDUCTOR MEMORY

[75] Inventor: Robert J. Proebsting, Dallas, Tex.

[73] Assignee: Mostek Corporation, Carrollton, Tex.

[21] Appl. No.: 599,208

[22] PCT Filed: Sep. 8, 1980

[86] PCT No.: PCT/US80/01150
 § 371 Date: Sep. 8, 1980
 § 102(e) Date: Sep. 8, 1980

Related U.S. Application Data

[63] Continuation of Ser. No. 516,865, Jul. 25, 1983, abandoned, which is a continuation of Ser. No. 251,533, filed as PCT US 80/01150, Sep. 8, 1980, published as WO 82/00896, Mar. 18, 1982, § 102(e) dated Sep. 8, 1980, abandoned.

[51] Int. Cl.³ .............................................. G01R 31/28
[52] U.S. Cl. .................................. 371/28; 324/73 R; 365/201; 371/21
[58] Field of Search ................... 371/21, 28; 365/201; 324/73 R, 210, 211

[56] References Cited

U.S. PATENT DOCUMENTS

| | | | |
|---|---|---|---|
| 3,506,814 | 4/1970 | MacDonald et al. | 371/28 |
| 3,795,859 | 3/1974 | Benante et al. | 371/28 |
| 3,916,306 | 10/1975 | Patti | 371/28 |
| 4,004,222 | 1/1977 | Gebhard | 371/21 |
| 4,055,754 | 10/1977 | Chesley | 365/201 |
| 4,301,535 | 11/1981 | McKenny et al. | 371/21 |

OTHER PUBLICATIONS

Womack, Schmoo Plot Analysis of Coincident-Current Memory Systems, IEEE Trans. on Electronic Computers, Feb. 1965, pp. 36-44.
Abadeer, Four-State Driver for Memory Testing, IBM Technical Disclosure Bulletin, vol. 23, No. 8, Jan. 1981, pp. 3605-3607.
Chin, Core Storage Unit Tester, IBM Technical Disclosure Bulletin, vol. 12, No. 3, Aug. 1969, pp. 447-448.
Krumm et al., Chip-in-Place Testing Method Permitting High Chip Densities on Ceramic Substrates, IBM Tech. Discl. Bulletin, vol. 23, No. 1, Jun. 1980, p. 204.
Kelley, Imbedded Memory Test Methods, IBM Technical Disclosure Bulletin, vol. 21, No. 12, May 1979, pp. 4911-4913.

Primary Examiner—Charles E. Atkinson

[57] ABSTRACT

A semiconductor memory circuit (140) includes a plurality of memory cells each having an access transistor (154, 158) and a storage capacitor (162, 166). The memory cells are connected to digit lines (142, 144) each of which is split into halves each connected to one input of a sense amplifier (146, 148). The sense amplifiers (146, 148) operate to pull one of the half digit lines connected thereto to ground while a pull up circuit (220) operates to elevate the other half digit line to the supply voltage. A margin test circuit receives through a control pin (236) an externally supplied test command which generates a test signal (318) to generate marginal low and marginal high voltage states to be written into the memory cells. The marginal low voltage state is generated by a voltage divider (288). The marginal high voltage state is generated by disabling the pull up circuit (220). To prevent loss of the marginal low state the sense amplifiers (146, 148 and 248) are disabled by the internally generated test signal. While the externally supplied test command is applied to the semiconductor memory circuit (140) marginal voltage states are applied to memory cells in accordance with externally supplied address and operational commands. The marginal voltage states are utilized to simplify testing of the circuit.

18 Claims, 3 Drawing Figures

GO/NO GO MARGIN TEST CIRCUIT FOR SEMICONDUCTOR MEMORY

This application is a continuation of application Ser. No. 516,865, filed Jul./25/83, which is a continuation of application Ser. No. 251,533, filed as PCT US 80/01150, Sep. 8, 1980, published as WO 82/00896, Mar. 18, 1982, § 102(e) dated Sep. 8, 1980, abandoned.

TECHNICAL FIELD

The present invention pertains to semiconductor memory circuits and in particular to a circuit for writing marginal voltage states into memory cells for test purposes.

BACKGROUND OF THE INVENTION

Integrated circuit semiconductor memories must of necessity operate with a high degree of reliability in order to be used in computer related applications. The production of errors on even infrequent occasions can cause serious problems in computer controlled operations and data processing. The nature of MOSFET (metal oxide semiconductor field effect transistor) memories is such that error conditions are not always consistent but frequently occur only under unique circumstances. In mass produced memory circuits certain ones of the memories will have greater resistance to error conditions while others will be more prone to the generation of errors.

Perhaps the most difficult aspect to test in semiconductor memories is that of pattern sensitivity. It is frequently the case that a particular erroneous data output produced by a semiconductor memory is caused by the pattern of data elements stored in the vicinity of the cell which produced the erroneous data output. This is primarily due to the extremely small sizes of the memory elements and numerous interconnecting lines which tend to produce parasitic capacitances. Due to the vast number of data combinations possible with even a moderate sized memory it is readily apparent that comprehensive pattern sensitivity testing can be very time consuming.

An additional error producing factor is the state of the memory cells in the previous cycle and the degree of voltage equilibration which takes place on split digit lines preceding a memory cycle. If the time for equilibration is reduced to increase the speed of the memory cycle, the degree of equalization of voltages on the digit lines is reduced and therefore, to some extent, the charge on the digit lines is dependent upon the state of the digit lines in the previous memory cycle. Since this condition is independent of pattern sensitivity it can tend to either reinforce or oppose the error voltage conditions produced by pattern sensitivity. This adds still a further dimension to the conditions under which the semiconductor memory circuit must be tested.

In most cases a semiconductor memory must be tested both by the manufacturer after fabrication and by the customer before inclusion in a product. The testing standards of the manufacturer and the customer are not necessarily the same.

As can be seen the testing of integrated circuit semiconductor memories is a necessary but heretofore time consuming operation. Therefore, there exists a need for a method and apparatus for testing a semiconductor memory circuit rapidly and efficiently to detect those circuits which cannot operate under marginal conditions. Such testing must apply the same standard of acceptability by each party performing a test of the memory circuit.

Margin testing has heretofore been accomplished with an adjustable input to measure the operating margins of stored cell voltage for each memory circuit. This testing permits anyone to sort the circuits according to margin levels. With the possibility of such sorting it is possible for customers to select the high margin circuits and reject others even though the other circuits meet manufactures specifications. The rejected low margin circuits may be returned to the manufacturer even though they are functional. This practice causes an economic loss to the manufacturer and eventually increases the costs of circuits.

DISCLOSURE OF THE INVENTION

A margin testing circuit is disclosed for a semiconductor memory having a plurality of memory cells in which first and second states are normally stored therein to represent binary data. The margin testing circuit is fabricated to be an integral part of the semiconductor memory. Circuitry is provided for receiving an externally supplied test command and for then generating a fixed amplitude test state which is typically a voltage level that is degraded from the normal voltage level stored in the memory cells. The test state, which is written into the memory cells, has an amplitude between the first and second states normally stored in the memory cells. The memory cells having the test states stored therein are subsequently read to produce an output signal to verify the functionality of the semiconductor memory.

BRIEF DESCRIPTION OF DRAWINGS

For a more complete understanding of the present invention and the advantages thereof, reference is now made to the following Description taken in conjunction with the accompanying Drawings in which.

DETAILED DESCRIPTION

Figure 1:
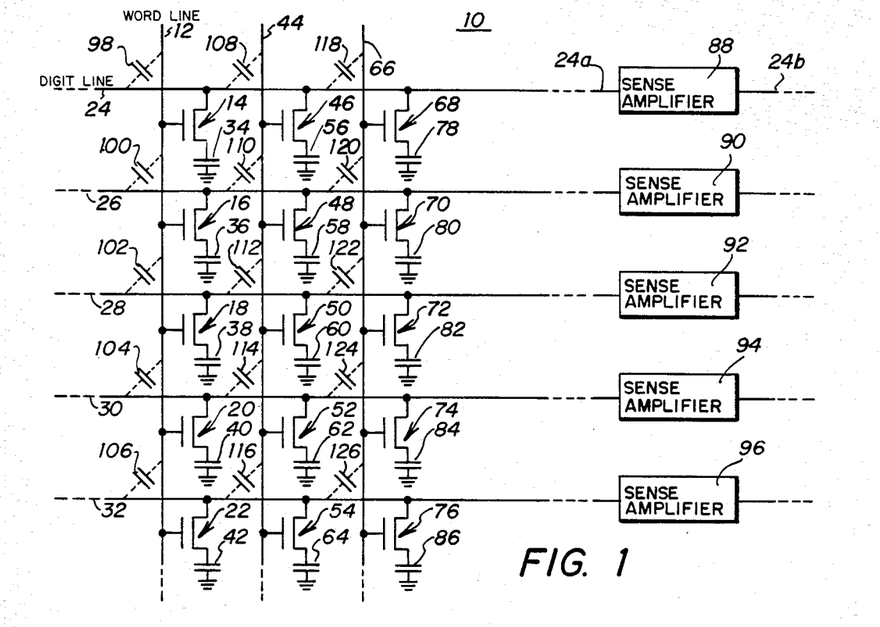
FIG. 1 is a schematic illustration of a portion of a semiconductor memory including memory cells, digit lines, word lines and sense amplifiers.

The most common conditions leading to bit errors in a semiconductor memory are described in reference to FIG. 1 which illustrates a portion of a semiconductor memory. A memory circuit 10 comprises a rectangular array of memory cells interconnected by various control and data lines and supporting circuitry. In particular a word line 12 carries a control signal to turn on or off a plurality of access transistors 14–22. The drain terminals of transistors 14–22 are connected respectively to digit lines 24–32. The source terminal for each of the access transistors 14–22 is connected respectively to storage capacitors 34–42. The other terminal for each of the storage capacitors is grounded. The combination of an access transistor together with the storage capacitor comprises a memory cell wherein a high voltage is stored in the cell to represent a first binary state and a low voltage is stored in the cell to represent a second binary state.

The memory array of circuit 10 continues with repeated memory cell layouts as described above and in particular as shown in FIG. 1 there is a word line 44 having access transistors 46–54 and respective storage capacitors 56–64. A further word line 66 is connected to control access transistors 68–76 connected to respective storage capacitors 78–86.

The digit lines 24–32 are split at the middle and each half of the digit line is connected to one input of a sense amplifier. Digit line 24, for example, is split into half digit lines 24a and 24b, each of which is connected to a differential sense amplifier 88. Both halves of each digit line are connected to a similar array of memory cells as described above and include a similar set of word lines. Sense amplifiers 88–96 are connected at the midpoints respectively of digit lines 24–32, there being a half digit line on either side of each sense amplifier.

In order to read a memory cell, a word line, such as 12, is brought to a high level thereby activating each of the access transistors along the word line. The transistors 14–22 are turned on by such action thereby coupling the corresponding storage capacitors to the connected half digit lines. The capacitance of the digit lines is substantially greater than that of the individual storage capacitors so the voltage change on the digit lines is quite small, on the order of a few tenths of a volt. The digit lines are established initially at a set voltage such that a high voltage stored on a memory storage capacitor produces a slightly elevated voltage on its half digit line over the initial voltage on its half digit line, while a zero level on the storage capacitor lowers the voltage on the corresponding half digit line by a slight amount. The sense amplifier, in conjunction with other circuitry illustrated in FIG. 2, operates to detect a slight voltage change on the connected half digit line relative to the unchanged voltage on the other half digit line. The sense amplifier thereby produces an output signal corresponding to the state which was read from the storage capacitor.

The write operation comprises essentially driving a half digit line, such as 24a, to either a high or low voltage depending upon the state which is to be stored in the memory cell. If it is desired to write into the memory cell comprising transistor 14 and capacitor 34, the word line 12 is activated thereby turning on access transistor 14 and storing on capacitor 34 the voltage level present on the half digit line 24a. The word line 12 is then returned to ground thereby turning off transistor 14 and isolating the capacitor 34 from line 24 to store a voltage state in the memory cell.

The great majority of errors in a semiconductor memory circuit occur when the sense amplifier does not defect properly the small signal provided by a memory cell. Since the digit lines and word lines are in extremely close proximity there is parasitic capacitive coupling between the lines at the various crossover points. This is illustrated by the dotted capacitors 98–126 at the crossovers of digit lines 24–32 and word lines 12, 44 and 66.

If, for example, high voltage states are read from any of the memory cells along the half digit line 24a, line 24a will be driven to an elevated voltage. This increase in voltage will be transmitted through capacitors 98, 108 and 118 to word lines 12, 44 and 66. If digit lines 26, 28 and 30 were also to receive elevated voltages, these increases in voltages would be likewise transmitted through the corresponding parasitic capacitors to word lines 12, 44 and 66. The overall voltages transmitted into word lines 12, 44 and 66 will be coupled through capacitors 106, 116 and 126 to elevate the voltage on digit line 32 even if no memory cell were connected to that line. The increase in voltage on half digit line 32 makes it more difficult to read out a low level which may be coupled through a storage capacitor to the half digit line 32. There is an increased probability that a high level reading will be produced on half digit line 32 regardless of the state on the storage capacitor in the memory cell coupled to this half digit line. This example illustrates one case of pattern sensitivity, that is, the increased probability of generating an error when attempting to read a low level from a cell when the other cells on the same word line are predominantly at high levels.

The inverse situation likewise produces a problem of pattern sensitivity. If the reading of memory cells reduces the voltage level on digit lines 24–30, this decrease in voltage is transmitted through the parasitic capacitors to word lines 12, 44 and 66 which in turn are capacitively coupled to digit line 32. Other digit lines (not shown) can be similarly coupled to digit line 32. This capacitive coupling tends to decrease the voltage on half digit line 32 thereby increasing the probability that a low level will be read out regardless of the actual state on the memory cell on line 32 which has been selected. This is the pattern sensitivity problem of attempting to read out a high voltage state in a field of low voltage states along the same word line.

A further error condition is that caused by precharge imbalance. As noted above the digit line 24 is divided into half digit lines 24a and 24b which are connected on either side of sense amplifier 88. The memory circuit 10 is constrained to operate such that a memory cell on only one of the lines 24a or 24b is read out during any particular cycle. Each memory cell connected to a digit line causes the voltage on the corresponding half digit line to be either elevated or depressed from the original preset voltage. After a memory cell is connected to one half digit line the sense amplifier compares the voltage on that half digit line to the unchanged voltage on the other half digit line and draws to ground the half digit line with the lower of the two voltages. The half digit line with the greater voltage is later elevated to a high voltage level by circuitry shown in FIG. 2. Since each of the memory cells can change the voltage on a half digit line by only a few tenths of a volt, it is critical to the operation of the memory circuit that the voltages on the two halves of each digit line be equal. Any error in precharge balancing will tend to upset the reading of the half digit lines and possibly produce an error.

In a 5 volt MOSFET memory, typical voltages stored on the memory capacitors are +5.0 volts and 0.0 volts. In general, the worst case for a parasitic capacitive coupling corresponds to the case which occurs when approximately a 0.3 volt offset occurs in the memory cells. That is, the storage of 4.7 volts in place of 5 volts on all memory cell capacitors sharing a word line corresponds essentially to the worst case of reading a high level of 5.0 volts in a field of 0.0 volt levels. Likewise the writing of a 0.3 volt level in place of a 0.0 volt level in all storage capacitors on a word line corresponds to the worst case of attempting to read a normal 0.0 volt low level in a field of 5.0 volt high levels. Further, the worst case for precharge voltage differential between the half digit lines corresponds to a voltage difference of approximately 0.2 volts on a storage capacitor. Therefore, for a memory circuit wherein the worst case sensitivities are 0.3 volts and 0.2 volts, the overall worst case is a voltage differential of 0.5 volts. This situation can be simulated by writing offset voltages of 4.5 volts in place of the normal 5.0 volts and 0.5 volts in place of the normal 0.0 volts in the memory cells and then reading these cells to check the capability of the memory to tolerate these worst case conditions.

The above shows two examples of pattern or sequence sensitivity out of numerous possible sources of error each with certain voltage margins. It is possible through testing and characterization of many varied patterns in a plurality of circuits to determine a single margin voltage such that any production circuit which passes at that margin voltage will be guaranteed to pass any combination of pattern and precharge conditions when written with normal cell voltages.

Figure 2:
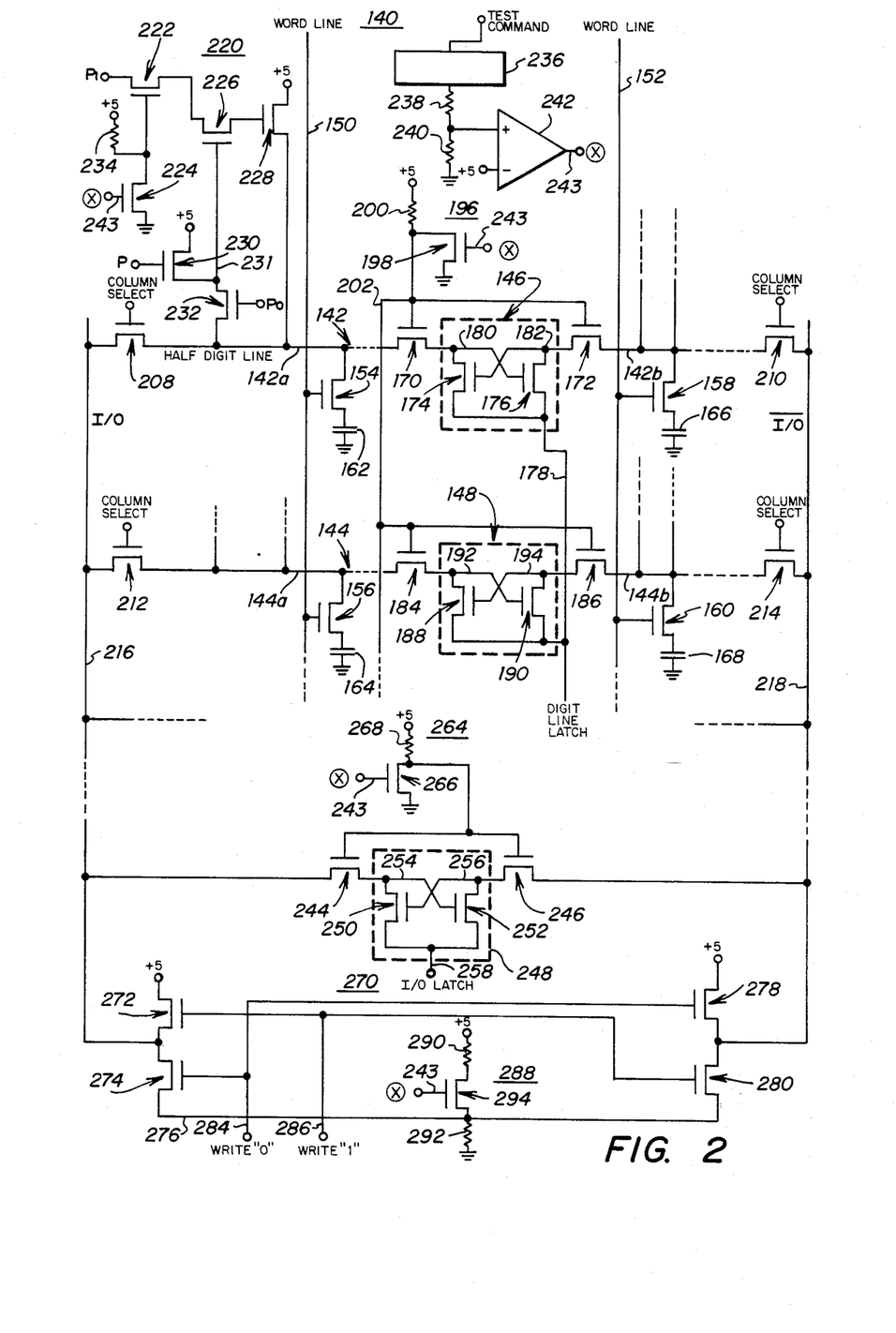
FIG. 2 is a schematic illustration of selected relevant portions of a semiconductor memory and includes the circuit elements comprising the margin test circuit of the present invention.

Portions of a semiconductor memory together with the margin test circuit of the present invention are shown in schematic diagram form in FIG. 2. As noted above in the discussion of the circuit shown in FIG. 1 the memory circuit can be tested under worst case conditions by applying marginal voltage states to the storage capacitors in the memory cells and then reading the cells to determine if the correct states are read. A form of margin testing has heretofore been utilized wherein an analog margin voltage is supplied externally and written directly into each of the memory cells. A conventional read operation is then carried out to determine the validity of the data stored in the cells. This method of testing has drawbacks.

First, there must be included a conductor, such as a dedicated pin, for transmitting the externally supplied voltage to the circuit. In most applications the pin functions are standardized and each pin available on a package is used. Therefore it is very difficult to provide a dedicated pin for testing standardized memory circuits which make up the bulk of the commercial market.

A further, and possibly more serious, problem is that of the possibility of varying the externally supplied margin test voltage to determine the degree of variance which the memory circuit can tolerate. If a part is designed such that a customer can easily test the circuit for varying degrees of margin, it is often the tendency of the customer to test the part with a greater margin level than the minimum established by the manufacturer for the part. Since the majority of memory circuits are tested by a customer before use in his products, the customer may wish to utilize only the very best, those with the highest margin, of the acceptable circuits rather than all of the acceptable circuits. When this occurs the customer frequently returns the circuits tested to be acceptable by the manufacturer, but tested by the customer to have a lower margin than the remainder of the circuits. The refusal to use the lower margin parts and the return of such parts can lead to substantial loss of revenue by the manufacturer when in fact such parts actually meet the standards set for such parts. This is a sufficiently serious problem that many manufacturers have chosen not to take advantage of the savings in testing costs permitted by the prior art analog margin test.

The present invention is therefore directed to a circuit which provides a margin test of a memory circuit in which the degree of margin is fixed by the manufacturer. This is termed a GO/NO GO test. The manufacturer fabricates the circuit to have the margin test as required by the part specification and such test will be carried out upon application of the test signal to a designated external pin. The test signal applied does not control the amplitude of the margin voltages which are applied to the memory cells. The external test command is either present or absent; it has no meaningful analog levels. Therefore, once a memory circuit passes the manufacturer's test, it can be tested again by the customer but only to the same standards which were tested by the manufacturer. If the memory circuit fails the customer acceptance GO/NO GO test it can be presumed to be defective, but if it passed the customer GO/NO GO test then the part at least meets the minimum specified standards and should be usable by the customer. The customer does not have an easily available sort capability, but is provided with a rapid and accurate means for testing memory circuits with automated equipment.

Referring to FIG. 2 the memory circuit 140 has a plurality of digit lines, such as 142 and 144 each of which is split into half digit lines a and b. A sense amplifier 146 is connected to each of the halves of digit line 142 and a sense amplifier 148 is connected to each half line of the digit line 144.

The circuit 140 includes a group of word lines, as exemplified by lines 150 and 152, each line connected to a plurality of memory cells. Word line 150 is connected to the gate terminals of a plurality of access transistors 154, 156 etc. Word line 152 likewise is connected to the gate terminals of access transistors 158, 160 etc. Transistors 154–160 are connected respectively to storage capacitors 162–168, the combination of an access transistor and a storage capacitor forming a memory cell.

The sense amplifier 146 is coupled to half digit lines 142a and 142b respectively through transistors 170 and 172. Amplifier 146 includes transistors 174 and 176 which have the source terminals thereof connected to a common latch node 178. Latch node 178 is supplied with a digit line latch signal as described in FIG. 3. The drain terminal of transistor 174 is connected to a node 180 which is further connected to the drain terminal of transistor 170 and to the gate terminal of transistor 176. Transistor 176 has the drain terminal thereof connected to a node 182 which is in turn connected to the drain terminal of transistor 172 and to the gate terminal of transistor 174.

Sense amplifier 148 corresponds to amplifier 146 and is coupled to the half digit lines 144a and 144b through transistors 184 and 186. Amplifier 148 is structurally similar to amplifier 146 and includes transistors 188 and 190 which are interconnected to nodes 192 and 194 and to latch node 178.

A sense amplifier disable circuit 196 comprises a transistor 198 and a resistor 200. The gate terminal of transistor 198 is connected to a terminal 243 to receive a test signal shown in FIG. 3. The source terminal of transistor 198 is grounded while the drain terminal thereof is connected to a first terminal of resistor 200. The second terminal of resistor 200 is connected to a +5 volt source. The drain terminal of transistor 198 is further connected to the gate terminals of transistors 170, 172, 184 and 186 through a node 202. Node 202 further interconnects the gate terminals of the corresponding transistors in the remainder of the memory circuit 140.

Each of the half digit lines is provided with a dedicated column select transistor. Lines 142a, 142b, 144a and 144b have respective column select transistors 208–214. The gate terminals of the column select transistors are connected to receive column select signals which are supplied to connect selected half digit lines to input/output lines 216 and 218.

Figure 3:
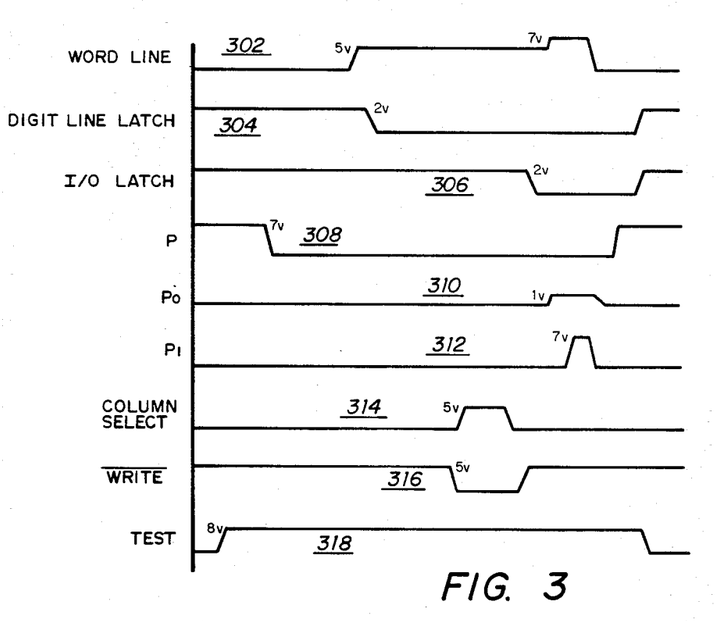
FIG. 3 is an illustration of relevant timing and command signals utilized in the circuit illustrated in FIG. 2.

Each of the half digit lines in circuit 140 is provided with a pull up circuit such as circuit 220 shown for line 142a. Circuit 220 comprises four transistors, 226, 228, 230 and 232. Transistors 222 and 224 are common to a plurality of pull up circuits throughout the memory circuit 140. Transistor 222 has the drain terminal thereof connected to receive a signal $P_1$ which is shown in FIG. 3. The source terminal of transistor 222 is connected to the drain terminals of a plurality of transistors such as transistor 226. The gate terminal of transistor 222 is connected to both the drain terminal of transistor 224 and through a resistor 234 to the +5 volt source. The gate terminal of transistor 224 is connected to receive a test signal transmitted through node 243 while the source terminal thereof is connected to a common node (ground).

The source terminal of transistor 226 is connected to the gate terminal of transistor 228 which has the drain terminal thereof connected to the 5 volt source. The source terminal of transistor 228 is connected to half digit line 142a. The gate terminal of transistor 226 is connected to both the source terminal of transistor 230 and to the drain terminal of transistor 232. The gate terminal of transistor 230 is connected to receive a P signal, which is shown in FIG. 3, while the drain terminal thereof is connected to the 5 volt source. Transistor 232 is connected to receive a $P_0$ signal, which is shown in FIG. 3, at the gate terminal thereof while the source terminal of transistor 232 is connected to half digit line 142a.

An external test command is supplied to an external pin 236, which is normally used for other purposes such as the refresh command. Pin 236 is connected to a voltage divider comprising resistors 238 and 240. The other terminal of resistor 240 is connected to the common ground node. A voltage comparator 242 has the noninverting input thereof connected to the junction of transistors 238 and 240 while the inverting input is connected to the 5 volt source. The output of the voltage comparator 242 at node 243 is the test signal $\overline{X}$ which is supplied to various terminals of the circuits shown in FIG. 2.

The input/output lines 216 and 218 are coupled through transistors 244 and 246 to a sense amplifier 248. Internally amplifier 248 is similar to amplifiers 146 and 148 and includes transistors 250 and 252 interconnected through nodes 254 and 256. The source terminals of transistors 250 and 252 are connected to an I/O latch node 258 which receives an I/O latch signal shown in FIG. 3.

An input/output line sense amplifier disable circuit 264 is provided for disconnecting amplifier 248 from the input/output lines. Circuit 264 includes a transistor 266 and a resistor 268. A first terminal of resistor 268 is connected to the +5 volt source and the second terminal thereof is connected to the drain terminal of transistor 266 and to the gate terminals of transistors 244 and 246. The source terminal of transistor 266 is connected to the common ground node. The gate terminal of transistor 266 is connected to receive the test signal $\overline{X}$ from node 243. Upon receipt of the test signal at transistor 266 the gate terminals of transistors 244 and 246 are driven to a low potential thereby isolating amplifier 248 from lines 216 and 218.

A write circuit 270 is provided for writing any of a group of predetermined voltage levels into the memory cells within circuit 140. Circuit 270 includes transistors 272 and 274. Complement input/output line 216 is connected to the source terminal of transistor 272 and the drain terminal of transistor 274. The drain terminal of transistor 272 is connected to the +5 volts supply while the source terminal of transistor 274 is connected to a node 276.

Circuit 270 further includes transistors 278 and 280 which are connected to true input/output line 218 through the source terminal of transistor 278 and the drain terminal of transistor 280. The drain terminal of transistor 278 is connected to the +5 volts source while the source terminal of transistor 280 is connected to node 276.

An external write command in conjunction with external data input are supplied to drive nodes 284 and 286 by circuitry not shown. Node 284 is connected to the gate terminals of transistors 274 and 278 while node 286 is connected to the gate terminals of transistors 272 and 280.

A low margin voltage circuit 288 is connected to the write circuit 270 to provide a marginal low voltage signal. Circuit 288 comprises resistors 290 and 292 along with transistor 294 which are connected in combination to form a voltage divider. Resistor 290 has a first terminal connected to the +5 volt supply and a second terminal connected to the drain terminal of transistor 294. Resistor 292 has a first terminal connected to the common node ground while a second terminal is connected to both the source terminal of transistor 294 and node 276. The gate terminal of transistor 294 is connected to receive the test signal $\overline{X}$ on node 243.

Various external commands and signals utilized in the circuits shown in FIG. 2 are illustrated in FIG. 3. These signals comprise word line signal 302, digit line latch signal 304, I/O latch signal 306, P signal 308, $P_0$ signal 310, $P_1$ signal 312, column select signal 314, $\overline{WRITE}$ signal 316, and test signal 318.

The procedure wherein voltage states are written into the memory cells and read from the memory cells is now described in reference to FIGS. 2 and 3. In a non-test normal write cycle either node 284 or node 286 is elevated to a high level to apply opposing voltage states to a complementary pair of half digit lines. For example, assume a binary "1" is to be written into the memory cell comprising transistor 154 and capacitor 162. A high level on node 286 turns on transistor 272 thereby raising line 216 to a high voltage. Likewise the voltage on node 286 turns on transistor 280 thereby providing a low voltage, essentially ground, to line 218. Through an externally supplied column address the column select signal 314 is applied to transistors 208 and 210 thereby causing half digit line 142a to be pulled to a high voltage level while half digit line 142b is driven to essentially ground. The voltage on line 142a will be lower than the supply voltage due to the threshold voltage drop across transistors 272 and 208 provided there is no elevated gate drive on these transistors. Thus, in a typical embodiment having a 5.0 volt supply there will be applied to line 142a a voltage of approximately 4.5 volts and 0.0 volts to line 142b.

The pull up circuit 220, when activiated, operates to elevate the voltage on the half digit line 142a up to the full supply voltage when line 142a is above a preset level. This, along with elevating the word line, serves to provide the full supply voltage into the corresponding storage capacitor such as 162. Circuit 220 operates as follows. The P signal 308 initially charges node 231 to approximately 5.0 volts. The $P_0$ signal at transistor 232 then reaches a maximum voltage of only approximately 1.0 volts and therefore does not turn on transistor 232 since line 142a is at approximately 4.5 volts. This leaves node 231 isolated and it remains charged to approximately 5.0 volts. Transistor 222 is turned on when the test signal at node 243 is low, which couples the 7 volt level of the $P_1$ signal 312 directly to the drain terminal of transistor 226. Since node 231 is at 5.0 volts while the source and drain of transistor 226 were at ground, there is a channel formed in transistor 226. This channel is electrically connected to the source and drain of transistor 226 and has substantial capacitance to the gate of transistor 226. When the drain of transistor 226 is elevated to 7.0 volts by the $p_1$ signal, the channel to gate capacitance of transistor 226 elevates the gate capacitance of transistor 226 from its initial 5.0 volt level to at least 8.0 volts. With 8.0 volts or more node 231 the full 7.0 volts of signal $P_1$ is transferred through transistor 226 to the gate of transistor 228. The voltage applied at the gate terminal of transistor 228 is in excess of one threshold above the 5.0 volt supply thereby charging the half digit line 142a to the full 5.0 volt supply.

For writing a binary "0" into storage capacitor 162 a high level is applied to node 284 which turns on transistors 274 and 278. A high level is appled through transistor 278 to line 218 and a low level through transistor 274 to line 216. This is the reverse of the procedure described above for writing a binary "1". The low level on line 216 is coupled through transistors 208 and 154 to capacitor 162.

A pull up circuit, such as 220 is connected to each of the half digit lines for carrying out the operation as described above. In the condition where the half digit line is at essentially a ground level, as for line 142a in the current example, a different result occurs. Upon receipt of $P_0$ signal 310, transistor 232 is turned on since line 142a is at ground so that the gate potential of transistor 232 exceeds its source potential by more than one threshold voltage. The turn on of transistor 232 serves to connect node 231 to ground thereby discharging node 231 and holding it at ground potential. Signal $P_1$ is received at transistor 222 and transmitted therethrough to the drain terminal of transistor 226, but there is no channel induced in transistor 226 since node 231 is being held at ground. Therefore, there is little capacitive coupling into node 231. The lack of capacitive coupling into node 231 and the holding of node 231 at ground by transistor 232 holds the gate terminal of transistor 228 low. In this case transistor 226 is not turned on and the 5.0 volt supply is not coupled to half digit line 142a. Thus, line 142a, when initially at ground, is not charged and remains at ground potential.

To complete the write operation the selected word line such as 150 is elevated by a word line signal 302 so that the access transistor 154 is turned on with the gate terminal at least one threshold voltage above the supply voltage thereby charging capacitor 162 to the 5.0 volt level supplied to line 142a. After capacitor 162 is charged, the voltage on word line 150 goes low thereby turning off transistor 154 and isolating capacitor 162 from line 142a.

A typical read operation is described as follows. Assume the read operation is to determine the charge state of capacitor 162. In response to an externally supplied address, word line signal 302 on line 150 is raised to a 5.0 volt level thereby coupling capacitor 162 through transistor 154 to line 142a. During a previous operation, described below, the half digit lines 142a and 142b have been equilibrated to have the same voltage thereon, typically 2.0 volts. Assuming that capacitor 162 is charged to a +5.0 volt state, the line 142a will be elevated to approximately a voltage of 2.2 volts since the capacitance of line 142a is about 10 to 20 times that of capacitor 162. After the capacitor 162 has been coupled to line 142a the digit latch signal 304 transitions from an initial 2.0 volt level to ground thereby pulling node 178 to ground.

During this typical read cycle the transistors 170 and 172 are turned on thereby coupling sense amplifier 146 to both lines 142a and 142b. As the voltage on latch node 178 decreases transistor 176 will be turned on, while transistor 174 remains off, since the voltage on node 180, 2.2 volts, exceeds the voltage on node 182, 2.0 volts. But when transistor 176 is turned on, node 182 and line 142b will be pulled to ground as node 178 is lowered. Transistor 174 will not be turned on at all during the sequence since the gate terminal thereof never exceeds one voltage threshold above node 178 due to the discharge of node 182. Thus, at the end of the latch cycle, line 142a is at a voltage of approximately 2.2 volts while line 142b has been pulled to ground.

The next sequenced operation is that of the pull up circuit 220. As described above circuit 220 elevates any half digit line connected thereto which is at a voltage above approximately 1.0 volt. In this case line 142a will be elevated to the full 5.0 volt supply potential.

Note that all of the transistors connected to word line 150 have been turned on so that the connected half digit lines have been either elevated or lowered in potential. In order to read out only the information from capacitor 162, an externally supplied column address activates transistors 208 and 210 thereby connecting the input-/output lines 216 and 218 to the half digit lines 142a and 142b respectively.

The I/O latch signal 306 is applied to I/O line sense amplifier 248 which functions in the same manner as the sense amplifier described above. Sense amplifier 248 causes the I/O line with the lower voltage to be pulled to ground while the other line remains at a high level. Thus, the state of the memory cell containing capacitor 162 is read out on I/O line 216 and the complementary state is produced on line 218. The information on the I/O lines is then transferred to an external pin as the data state of the addressed memory cell.

Note that during the routine write operation circuitry is provided to insure that the maximum voltage extremes are applied to the storage capacitors. The sense amplifier pulls one half of each digit line to ground potential while the pull up circuit elevates the other half digit line to the full supply voltage. In order to input marginal test voltages into the memory cells it is necessary not only to generate these voltages but to disconnect the various sense amplifiers and pull up circuits so that the marginal voltages can be supplied to the individual memory cells without alteration.

The various sense amplifiers are disconnected and the margin voltages are generated in response to a test signal which is generated in response to a user supplied test command. The test command is an externally supplied signal which may be input on a pin that is normally used for other control purposes. For example, the test command can be input on the refresh pin (pin 1) of a memory circuit. The normal voltage states on this pin for control operations are 0 and 5.0 volts. The test command signal is an otherwise illegal voltage state applied to this pin. In a preferred embodiment the test command comprises an 8.0 volt signal. Under normal operating conditions when the maximum voltage applied to pin 1 is 5.0 volts the maximum voltage at the junction of the resistors 238 and 240 is approximately 3 volts, and this junction is connected to the noninverting input of a comparator 242. The second input to the comparator 242 is the 5.0 volt supply level Thus, the output of comparator 242 at node 243 will normally be a low level. But upon application of 8.0 volts or more, the voltage at the junction of resistors 238 and 240 will be elevated above 5.0 volts thereby activating comparator 242 to produce a high level ouput signal. This output test signal (X) is produced on node 243 and transmitted to the various disable and voltage divider circuits which form parts of the margin test circuit of the present invention.

The digit line sense amplfiers are disconnected by circuit 196. When the test signal (X) on node 243 is driven to the active state (high) transistor 198 is turned on thereby pulling node 202 to essentially ground. This action applies a low potential to the gate terminals of various transistors, such as 170, 172, 184 and 186, which are turned off to isolate the sense amplifiers from the corresponding half digit lines. With the sense amplifiers thus isolated there can be no pulling of the half digit lines down to ground upon receipt of the digit line latch signal 304.

A similar disable circuit 264 is provided for isolating the input/output line sense amplifier 248. Upon generation of the active state of the test signal (X) on node 243 transistor 266 is turned on thereby pulling the gate terminals of transistors 244 and 246 to ground which causes these transistors to be turned off. When transistors 244 and 246 are in the off state sense amplifier 248 is disconnected from input/output lines 216 and 218. In this condition the sense amplifier 248 cannot pull either of these two lines to ground.

The pull up circuit 220 must also be disabled in order to write in a marginal high voltage. When the test signal goes into the active state on node 243 transistor 224 is turned on thereby turning off transistor 222. When the P₁ signal 312 is isolated from the pull up circuit there cannot be any activation of transistor 226 and therefore transistor 228. Thus when the test signal (X) is in the active state the pull up circuit 220 is disabled and cannot apply a high potential to the corresponding half digit line.

The marginal low voltage state is generated by circuit 288. Upon activation of the test signal at node 243 transistor 294 is turned on thereby connecting resistors 290 and 292 as a voltage divider between the 5 volt supply and the common node ground. Under this condition node 276 is set to a voltage of approximately 0.5 volts if the ratio of resistances of resistors 290 to 292 is approximately nine to one. Thus when the test signal is activated on node 243 there will be approximately 0.5 volts applied to node 276. When a high level is applied to write command node 284 the 0.5 volt level on node 276 is coupled through transistor 274 to line 216. Upon activation of a column select signal the line 216 will be connected to the correct half digit line so that the half digit line is also pulled to 0.5 volts. The activation of a word line turns on an access transistor, such as 154 to couple a storage capacitor such as 162 to the half digit line 142a. Under these conditions the 0.5 volt level will be written into the storage capacitor 162.

A similar operation occurs when a high level is applied to write command node 286 thereby coupling input/output line 218 through transistor 280 to node 276. In that case the 0.5 volt level will be transferred through line 218 to the selected half digit line for charging the selected memory cell. Note that the level of the marginal low voltage state can be easily determined by the selection of resistors 290 and 292. These resistors are fabricated as an integral part of the semiconductor memory circuit such that they are not subject to change after the circuit as a whole has been fabricated.

The marginal high voltage is applied to the memory cells by disabling all of the pull up circuits, such as 220. In the test mode the test signal (X) is driven to an active state, high, which is coupled to the gate terminal of transistor 224. As noted above the high level on this terminal disables the pull up circuit. The voltage supplied to a half digit line through transistor 272 or 278 can only reach a voltage one transistor threshold below the supply voltage since the gates of these transistors are not driven above the supply voltage. The voltage on lines 216 or 218 is therefore one transistor threshold voltage $V_T$ below 5.0 volts. The voltage on lines 216 and 218 is further coupled through the column select transistors, such as 208 and 210 to the half digit lines and through the access transistor to the storage capacitor. The actual voltage which is to be supplied as the high margin test voltage is determined by the threshold voltage of transistor 272 or transistor 208, whichever threshold is greater. The threshold voltages can be adjusted to a desired voltage by the use of ion implantation. After the high margin voltage is applied to the appropriate half digit line as determined by an address received externally, the appropriate word line is in a high state to couple the capacitor in the memory cell to the half digit line. The activation voltage on the word line is sufficiently high to transfer the desired high margin voltage into the storage capacitor from the half digit line. The access transistor is then turned off to isolate the storage capacitor from the digit line.

From the above it can be seen that both the low margin test voltage and the high margin test voltage can be preset in the fabrication of the integrated semiconductor memory circuit. Since the operating voltage for the circuit is predefined this operation also defines the voltage differential between the normal high and low voltage states and the margin voltage test states. By activating the memory circuit it is possible with the present invention to write an intentionaly degraded high level state in place of the normal high level or an intentionally degraded low level in place of the normal low level.

The externally supplied test command signal is input to the semiconductor memory circuit 140 during a write cycle so that the margin voltages are applied to the various memory cells. The cell location for the writing of the margin voltage is determined by the normal addressing supplied externally. In a typical test sequence the test command is applied to pin 1 thereby activating the various internal text circuits. While the test command is applied, addresses and write command signals are applied to write a desired test pattern such as all ones or all zeros into the memory cells. By using a page mode operation one row can remain selected while sequencing through all columns to write marginal levels into cells along that row. This process is repeated for each of the rows throughout the memory. With all memory cells in the memory having marginal levels normal read cycles are performed to verify correct operation of the memory with the marginal levels. Testing can be further carried out under different temperatures so that the temperature sensitivity of the circuit can be measured.

Correct operations of the memory with a simple pattern such as all "1's" or all "0's" but with marginal levels guarantees proper operation of the memory just as would time consuming complex pattern tests with normal voltage levels.

In summary, the present invention provides a margin test circuit wherein an externally supplied test command generates preset marginal high and low test voltages that are written into the memory cells in response to externally supplied write commands and addresses. The test command signal disables the internal circuitry which is normally utilized to insure that the maximum voltage extremes are applied to the memory cells. The voltage differentials of the margin test voltages as compared to the normal operational voltages are determined by the fabrication of various elements integral with the semiconductor memory. The margin test voltages are fixed during fabrication and are not subject to variation by externally supplied signals.

Although one embodiment of the invention has been illustrated in the accompanying drawings and described in the foregoing detailed description, it will be understood that the invention is not limited to the embodiment disclosed, but is capable of numerous rearrangements, modifications and substitutions without departing from the scope of the invention.

I claim:

1. A margin testing circuit for a semiconductor memory having a plurality of memory cells in which first and second states are normally stored therein to represent binary data, the testing circuit comprising elements integral with said memory including:
    means for receiving a test command,
    means for generating a fixed test state in response to receiving said test command, said test state having an amplitude between said first and said second states when said semiconductor memory is operated with normal power supply voltage levels, and
    means for storing said test state in at least one of said memory cells.

2. The circuit recited in claim 1 wherein said means for generating a fixed test state is a resistive divider network.

3. The circuit recited in claim 1 wherein the amplitude of said test state is one transistor threshold offset from said first state.

4. A margin testing circuit for a semiconductor memory having a plurality of memory cells in which first and second operational states are normally stored therein to represent binary data states, the testing circuit comprising elements integral with said memory and including:
    means for receiving a test command,
    means for generating a first fixed test state in response to receiving a test command, said first test state offset from said first operational state by a first predetermined differential when said semiconductor memory is operated with normal power supply voltage levels,
    means for generating a second fixed test state in response to receiving a test command, said second test state offset from said second operational state by a second predetermined differential, and
    means for storing said first and second test states in said memory cells.

5. The circuit recited in claim 4 wherein said means for generating a first test state is a resistive divider network.

6. The circuit recited in claim 4 wherein said second test state is offset one transistor threshold from said first operational state.

7. In an integrated semiconductor memory circuit having memory cells which are connected to half digit lines organized in complementary pairs, the memory cells producing differential voltages on the half digit lines, a digit line sense amplifier connected to each pair of half digit lines for drawing one of the lines to a first voltage state, a pull up circuit connected to each half digit line for pulling the line to a second voltage state, and an input/output line sense amplifier connected to input/output lines that are selectively connected to the half digit lines for drawing a selected one of the input/output lines to the first voltage state, a margin test circuit integral with said memory circuit comprising:
    means responsive to an externally supplied test command for generating a test signal;
    means for disconnecting said digit line sense amplifiers from said half digit lines in response to said test signal;
    means for disconnecting said input/output line sense amplifiers from said input/output lines in response to said test signal;
    means responsive to said test signal and to a first write command signal for driving a selected one of said half digit lines to a first preset margin test voltage; and
    means responsive to said test signal and to a second write command signal for driving a selected one of said half digit lines to a second preset margin test voltage.

8. The margin test circuit recited in claim 7 wherein said means for producing a first preset margin test voltage on said half digit lines comprises:
    means responsive to said test signal for generating said first preset margin test voltage; and
    means responsive to said first write command for transmitting said first preset margin test voltage to said selected half digit line.

9. The margin test circuit recited in claim 8 wherein said means responsive to said test signal for generating said first preset margin test voltage comprises:
    a transistor having gate, drain and source terminals, the gate terminal thereof connected to receive said test signal;
    a first resistor having a first terminal thereof connected to a fixed voltage terminal and a second terminal thereof connected to the drain terminal of said transistor; and
    a second resistor having a first terminal thereof connected to a common node and a second terminal thereof connected to the source terminal of said transistor whereby said first and second resistors function as a voltage divider to generate said first preset margin test voltage at said source terminal when said test signal is applied to the gate terminal of said transistor.

10. The margin test circuit recited in claim 7 wherein said means for producing a second preset margin test voltage comprises:
    means responsive to said write command signal for coupling the drain and source terminals of a transistor between a fixed voltage node and said selected half digit line, the gate terminal thereof biased to produce a one transistor voltage drop across said transistor whereby said second preset margin test voltage is equal to the voltage at said fixed voltage node minus said transistor threshold voltage.

11. In an integrated semiconductor memory circuit where high and low voltage states are written into memory cells to represent binary data, said writing in response to write command signals, the memory circuit having a plurality of external pins for receiving control signals and data at high and low voltage states, a margin test circuit comprising circuit elements integral with said memory circuit including:
 means for monitoring one of said selected external pins to detect the presence of a test voltage at said selected pin, said test voltage being outside the ranges of said high and low voltage states;
 means for generating a test signal in response to the detection of said test voltage; and
 means for writing a marginal high voltage state or a marginal low voltage state into said memory cells, said writing in response to said test signal and to said write command signals, said marginal high voltage state offset from said high voltage state by a first preset voltage differential and said marginal low voltage state offset from said low voltage state by a second preset voltage differential.

12. The margin test circuit recited in claim 11 wherein said marginal low voltage state is greater than said low voltage state and said marginal high voltage state is less than said high voltage state.

13. The margin test circuit recited in claim 11 wherein the absolute magnitude of said preset voltage differentials is in the range of 0 to 1 volt.

14. A method for margin testing an integrated semiconductor memory having a plurality of memory cells and being operated with normal power supply voltage levels comprising the steps of:
 applying a test command to the memory,
 generating within said semiconductor memory a degraded signal after receipt of the test command, the degraded signal having a fixed amplitude which is offset from the amplitude of a preferred signal state normally stored in the memory cells,
 storing said degraded signal in at least one of said memory cells, and
 reading said memory cell having said degraded signal stored therein to produce an output signal therefrom.

15. A method for margin testing an integrated semiconductor memory circuit having memory cells which are connected to half digit lines organized in complementary pairs, the memory cells producing differential voltages on the half digit lines, a digit line sense amplifier connected to each pair of half digit lines for drawing one of the lines to a first voltage state, a pull up circuit connected to each half digit line for selectively pulling the line to a second voltage state, and an input-/output line sense amplifier connected to input/output lines that are selectively connected to said half digit lines for drawing a selected one of said input/output lines to the first voltage state, said memory circuit having a plurality of external pins, the method comprising the steps of:
 monitoring a selected external pin to detect a test command voltage applied thereto;
 generating an active state of a test signal upon detection of said test command voltage;
 disconnecting said digit line sense amplifier when said test signal is in said active state;
 disconnecting said input/output sense amplifiers when said test signal is in said active state;
 providing a first preset margin test voltage to selected ones of said half digit lines for storing said first preset margin test voltage in at least one of said memory cells in response to a write command when said test signal is in said active state, said first preset margin test voltage corresponding to a first binary state; and
 providing a second preset margin test voltage to selected ones of said half digit lines for storing said second preset margin test voltage in at least one of said memory cells in response to a write command when said test signal is in said active state, said second preset margin test voltage corresponding to a second binary state.

16. The method for margin testing recited in claim 15 wherein the step of providing a first preset margin test voltage comprises the steps of:
 tapping a center node of a voltage divider connected between a fixed voltage node and a common node to produce said first preset margin test voltage when said test signal is in said active state; and
 transmitting said first margin test voltage from said voltage divider through a plurality of transistors to said half digit lines in response to said write commands.

17. The method for margin testing recited in claim 15 wherein the step of producing a second preset margin test voltage comprises disabling said pull up circuits and applying a power supply voltage minus a transistor threshold voltage to said half digit lines in response to said write command signals.

18. A method for margin testing an integrated semiconductor memory circuit having memory cells which receive high and low voltage states to represent binary data, the writing of data into the memory cells carried out in response to write commands, the memory circuit having a plurality of external pins for receiving data and control signals at said high and low voltage states, the method comprising the steps of:
 monitoring a selected one of said external pins to detect the presence of a test voltage at said selected pin, said test voltage being outside the ranges of said high and low voltage states;
 generating the active state of a test signal in response to the detection of said test voltage; and
 writing marginal high voltage states and marginal low voltage states into said memory cells to represent binary data, said writing in response to said test signal and to said write command signals, said marginal high voltage state offset from said high voltage state by a first preset voltage differential and said marginal low voltage state offset from said low voltage state by a second preset voltage differential.

* * * * *